(12) United States Patent
Kuo

(10) Patent No.: US 7,532,473 B2
(45) Date of Patent: May 12, 2009

(54) COOLING APPARATUS WITH ELECTROMAGNETIC INTERFERENCE SHIELDING FUNCTION

(75) Inventor: Szu-Wei Kuo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 21 days.

(21) Appl. No.: 11/681,192

(22) Filed: Mar. 2, 2007

(65) Prior Publication Data
US 2007/0242431 A1  Oct. 18, 2007

(51) Int. Cl.
*H05K 7/20* (2006.01)
*F28F 7/00* (2006.01)
*H05K 5/00* (2006.01)

(52) U.S. Cl. .................. 361/697; 361/695; 361/800; 361/818; 165/80.3; 174/16.3; 454/184

(58) Field of Classification Search ............ 361/690, 361/694–695, 697, 699–704, 800, 816, 818; 165/80.3, 104.33, 185; 174/15.2, 16.1, 16.3; 454/184
See application file for complete search history.

(56) References Cited

U.S. PATENT DOCUMENTS

| | | | |
|---|---|---|---|
| 5,880,930 A | | 3/1999 | Wheaton |
| 6,163,454 A | * | 12/2000 | Strickler ................ 361/695 |
| 6,167,949 B1 | | 1/2001 | Langley et al. |
| 6,172,416 B1 | | 1/2001 | Miyahara et al. |
| 6,297,446 B1 | * | 10/2001 | Cherniski et al. ........ 174/383 |
| 6,478,082 B1 | * | 11/2002 | Li .......................... 165/185 |
| 6,667,882 B2 | * | 12/2003 | Pauser .................... 361/695 |
| 6,680,847 B2 | * | 1/2004 | Heard ..................... 361/692 |
| 6,813,152 B2 | * | 11/2004 | Perazzo .................. 361/695 |
| 6,864,698 B2 | * | 3/2005 | Mirkhani et al. ......... 324/760 |
| 7,183,500 B2 | * | 2/2007 | Campini et al. .......... 174/392 |
| 2007/0147000 A1 | * | 6/2007 | Kuo ....................... 361/704 |

* cited by examiner

*Primary Examiner*—Jayprakash N Gandhi
*Assistant Examiner*—Zachary M Pape
(74) *Attorney, Agent, or Firm*—Wei Te Chung

(57) ABSTRACT

A cooling apparatus is used for cooling an electronic element. The cooling apparatus includes a fan and a fan duct. The fan is for generating airflow. The fan duct including an inlet, an outlet, and a first metal net fixed in one of the inlet and the outlet, is for guiding the airflow. The inlet is for allowing air to enter the fan duct. The outlet is for allowing air to flow out from the fan duct. The first metal net defines a plurality of guiding holes for the airflow to pass through, and a maximum distance in a traverse direction of each of the guiding holes is smaller than one twentieth of a wavelength of an electromagnetic wave emitted from the electronic element. An electronic device using the cooling apparatus is also disclosed.

13 Claims, 5 Drawing Sheets

COOLING APPARATUS WITH ELECTROMAGNETIC INTERFERENCE SHIELDING FUNCTION

BACKGROUND OF THE INVENTION

1. Field of the Invention

The present invention generally relates to cooling apparatuses for dissipating heat of electronic devices, and particularly to a cooling apparatus with electromagnetic interference shielding function.

2. Description of Related Art

Electronic devices are widely used in our daily life. These electronic devices facilitate our working, living, and playing. Although many improvements have been made, there are still some difficulties in designing for effective heat dissipation and electromagnetic interference (EMI) shielding.

To reduce EMI among electronic elements, an EMI shield is used to enclose the electronic element thus attenuating EMI. However, electronic elements generate a lot of heat, which must be dissipated before the electronic element is damaged or destroyed.

A cooling apparatus is generally used to dissipate heat generated by electronic elements. There are typically two types of cooling apparatuses. A first type cooling apparatus uses a heat sink with fins, attached to the electronic element, for absorbing and conducting heat. A second type cooling apparatus uses a fan and a fan duct to dissipate the heat. The fan duct has an outlet in which the electronic element is placed. The fan produces an airflow that takes the heat generated by the electronic element out the outlet via the fan duct.

It is difficult to shield EMI and dissipate heat at the same time. Regarding the EMI shielding technology, the shield prevents heat from escaping. Regarding the first type cooling apparatus, the fins act as antennas that enhance EMI. Regarding the second type of cooling apparatus, EMI can be travel out through the outlet.

Therefore, a cooling apparatus with EMI shielding function is needed in the industry to address the aforementioned deficiencies and inadequacies.

SUMMARY OF THE INVENTION

A cooling apparatus is used for cooling an electronic element. The cooling apparatus includes a fan and a fan duct. The fan is for generating airflow. The fan duct including an inlet, an outlet, and a first metal net fixed in one of the inlet and the outlet, is for guiding the airflow. The inlet is for allowing air to enter the fan duct. The outlet is for allowing air to flow out from the fan duct. The first metal net defines a plurality of guiding holes for the airflow to pass through, and a maximum distance in a traverse direction of each of the guiding holes is smaller than one twentieth of a wavelength of an electromagnetic wave emitted from the electronic element. An electronic device using the cooling apparatus is also disclosed.

Other systems, methods, features, and advantages of the present cooling apparatus and the present computer will be or become apparent to one with skill in the art upon examination of the following drawings and detailed description. It is intended that all such additional systems, methods, features, and advantages be included within this description, be within the scope of the present device, and be protected by the accompanying claims.

BRIEF DESCRIPTION OF THE DRAWINGS

Many aspects of the present cooling apparatus and the present computer can be better understood with reference to the following drawings. The components in the drawings are not necessarily to scale, emphasis instead being placed upon clearly illustrating the principles of the present device. Moreover, in the drawings, like reference numerals designate corresponding parts throughout the several views.

DETAILED DESCRIPTION OF THE INVENTION

Reference will now be made to the drawings to describe a preferred embodiment of the present cooling apparatus.

Figure 1:
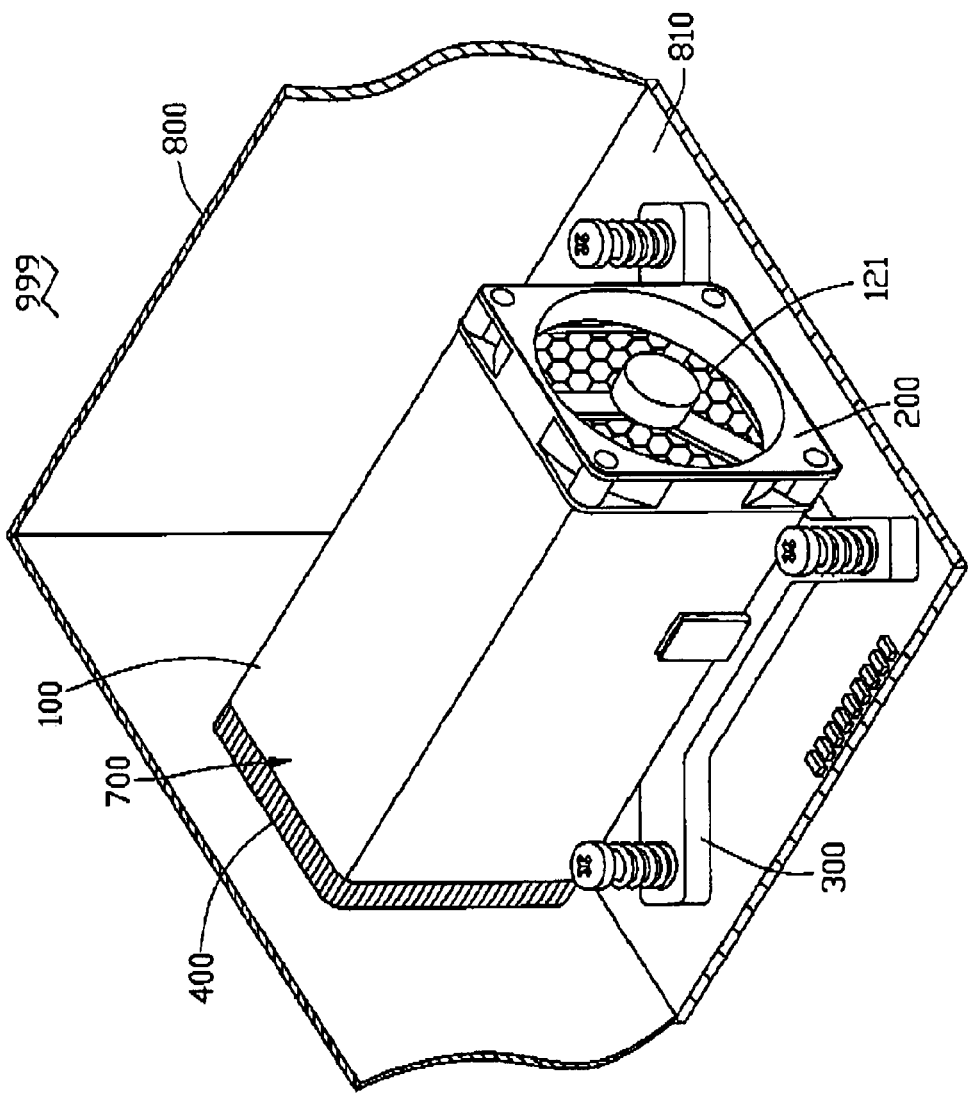
FIG. 1 is an assembled, isometric view of a cooling apparatus of a computer in accordance with an exemplary embodiment.
Figure 2:
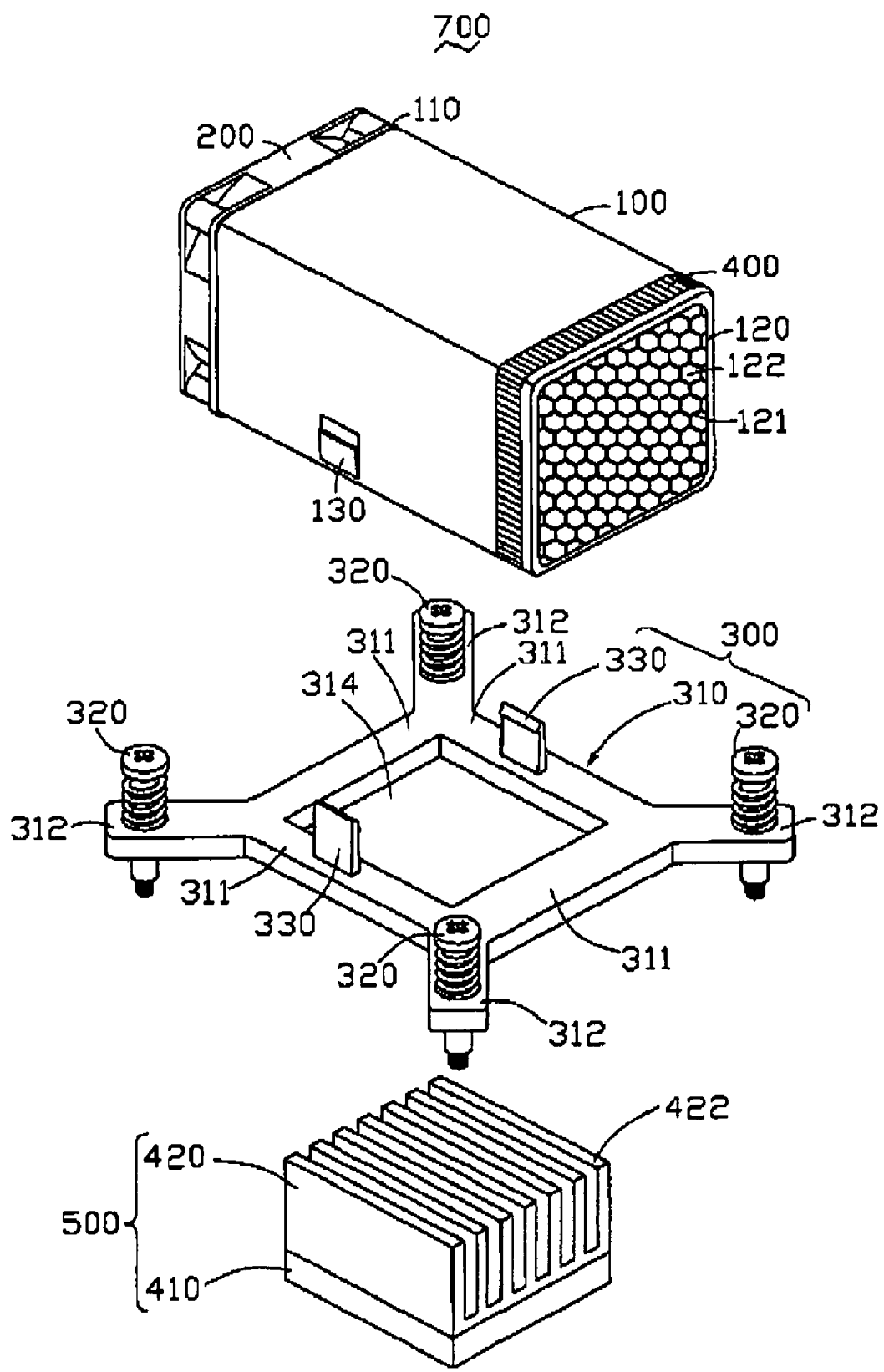
FIG. 2 is an exploded, isometric view of the cooling apparatus and an electronic element for being cooled.

Referring to FIGS. 1 and 2, a cooling apparatus 700, in accordance with an exemplary embodiment, is configured for cooling an electronic element 500 including a heat source 410, such as a CPU, a power supply, etc., positioned in a housing 800 of a computer 999. The cooling apparatus 700 includes a fan duct 100, a fan 200, a supporting device 300, and a shield 400. The fan duct 100 is for enclosing the electronic element 500. The fan 200 is for generating airflow to flow through the fan duct 100 thereby dissipating heat away from the electronic element 500. The supporting device 300 is for supporting and fixing the fan duct 100. The shield 400 is for shielding electromagnetic waves emitted from the electronic element 500 in the housing 800.

Figure 4:
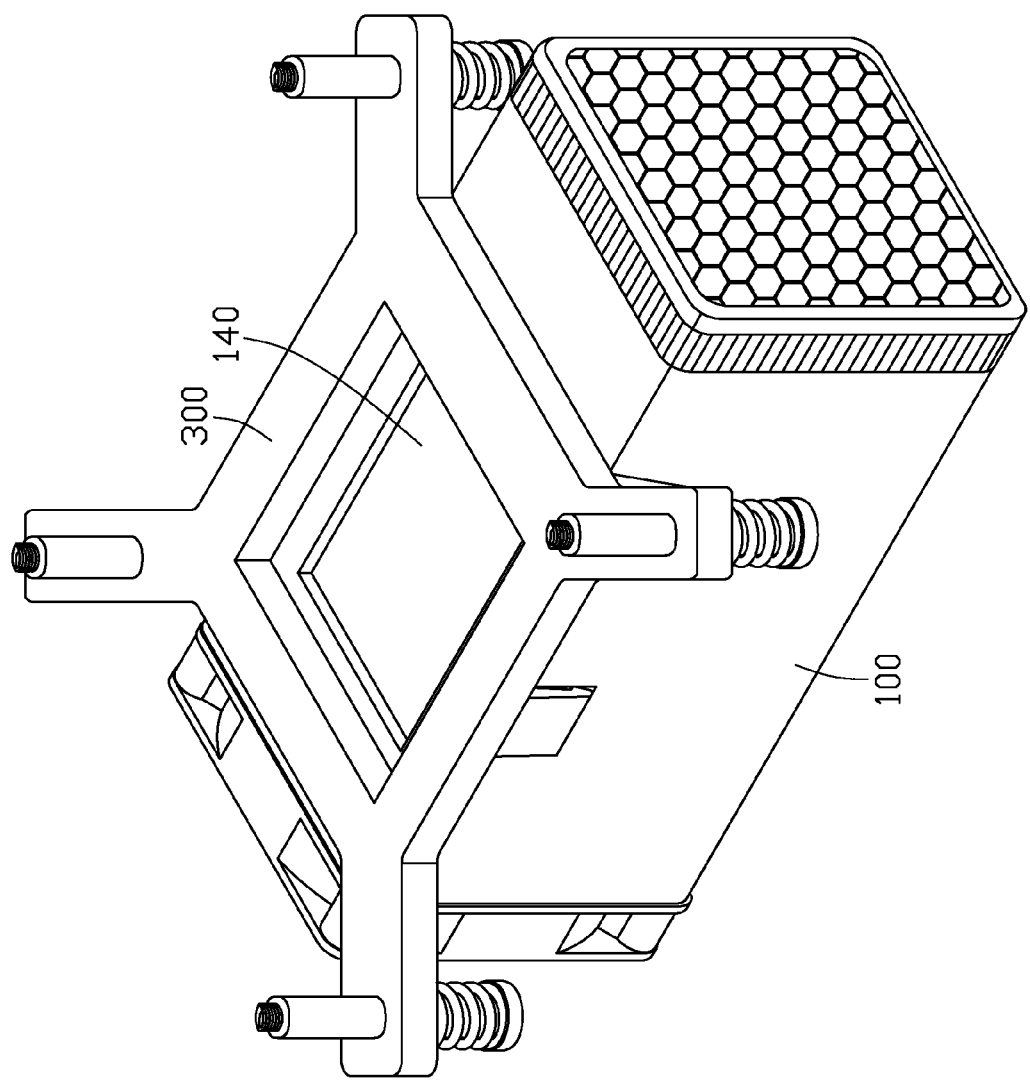
FIG. 4 is an assembled, isometric view of the cooling apparatus but viewed from an opposite aspect to the view of FIG. 3.

Referring also to FIG. 4, the fan duct 100 may be a hollow pipe with a square section. The fan duct 100 includes an inlet 110 at one end, an outlet 120 at the other end, and two first clipping members 130 respectively formed at two opposite side walls of the fan duct 100. A first opening 140 is defined in another side wall of the fan duct 100 between the opposite side walls. Two metal nets 121 are respectively fixed In the inlet 110 and the outlet 120.

The fan 200 is fixed abutting the metal net 121 in the inlet 110, to generate airflow flowing into the fan duct 100 via the inlet 110 and out the fan duct 100 via the outlet 120.

Figure 3:
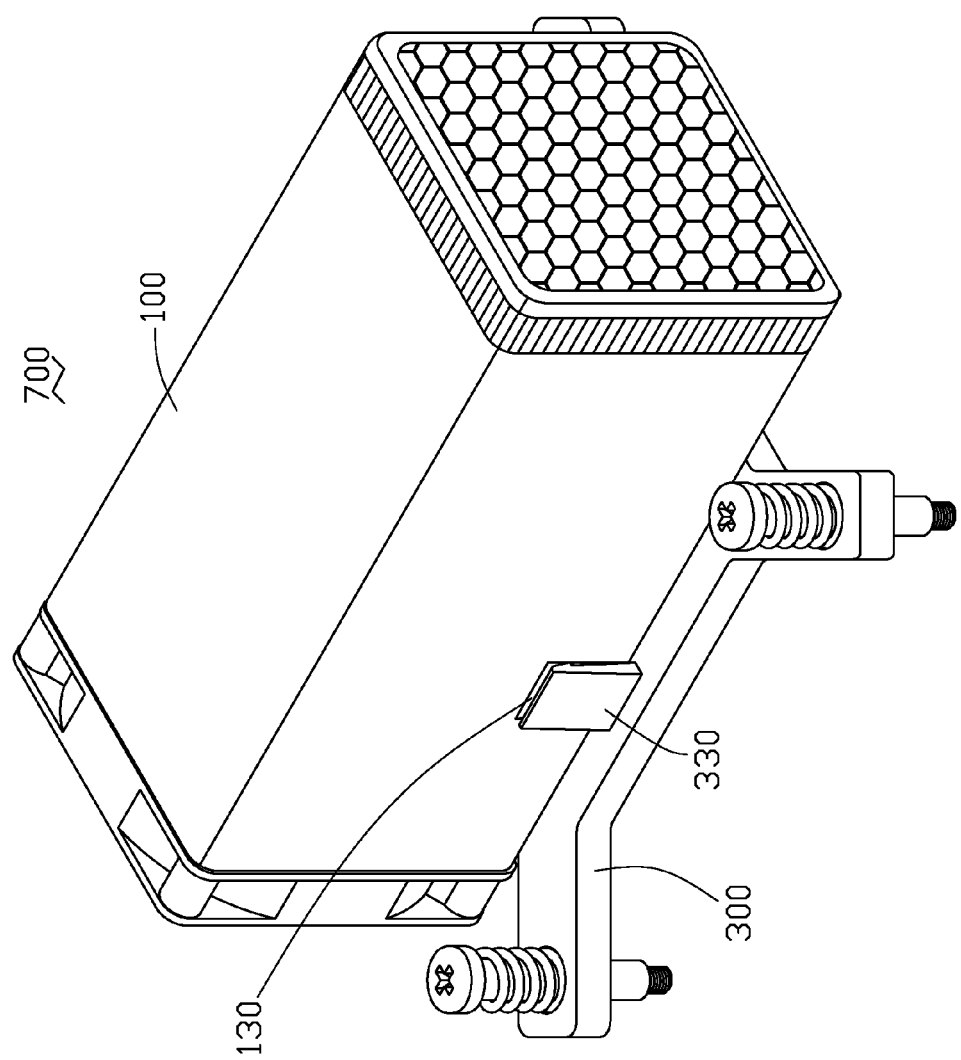
FIG. 3 is an assembled, isometric view of the cooling apparatus but viewed from another aspect.

The supporting device 300 includes a rectangular frame 310, four fasteners 320, and two second clipping members 330. Four legs 312 extending from corners of the frame 310, and the fasteners 320 extending through the legs 312 respectively. The frame 310 includes four interconnecting beams 311, and a second opening 314 is defined in a center of the frame 310 and surrounded by the four beams 311. Each leg 312 extends away from a corresponding corner of the frame 310. The second opening 314 corresponds to the first opening 140, and the electronic element 500 can be received into a passage in the fan duct 100 through the first and second openings 140, 314. Alternatively, the electronic clement 500 comprises a beat sink 420 with a plurality of parallel fins 422 mounted thereon and received into the passage of the fan duct 100. Each fastener 320 is set in a hole (not labeled) defined in each leg 312, to fix the frame 310 onto a board 810 in the housing 800. Two second clipping members 330 are respectively formed on two opposite beams 311, to engage with the first clipping members 130 to fasten the fan duct 100 to the supporting device 300 (referring to FIG. 3).

The shield 400 is set around the outlet 120 of the fan duct 100. The shield 400 is made of conductive materials, such as copper, aluminum, steel, etc.

Each metal net 121 defines a plurality of through guiding holes 122 therein for the airflow to pass through. A maximum distance In a traverse direction of each guiding hole 122 is smaller than one twentieth of a wavelength of an electromagnetic wave emitted from the electronic element 500, preferably smaller than one percent of the wavelength of the electromagnetic wave emitted from the electronic element 500. A depth of each guiding hole 122 is comparatively great enough to deflect the electromagnetic wave many times, thus attenuating the electromagnetic wave. The holes 122 are arranged in an array type, such as a honeycomb type, a network type etc.

Figure 5:
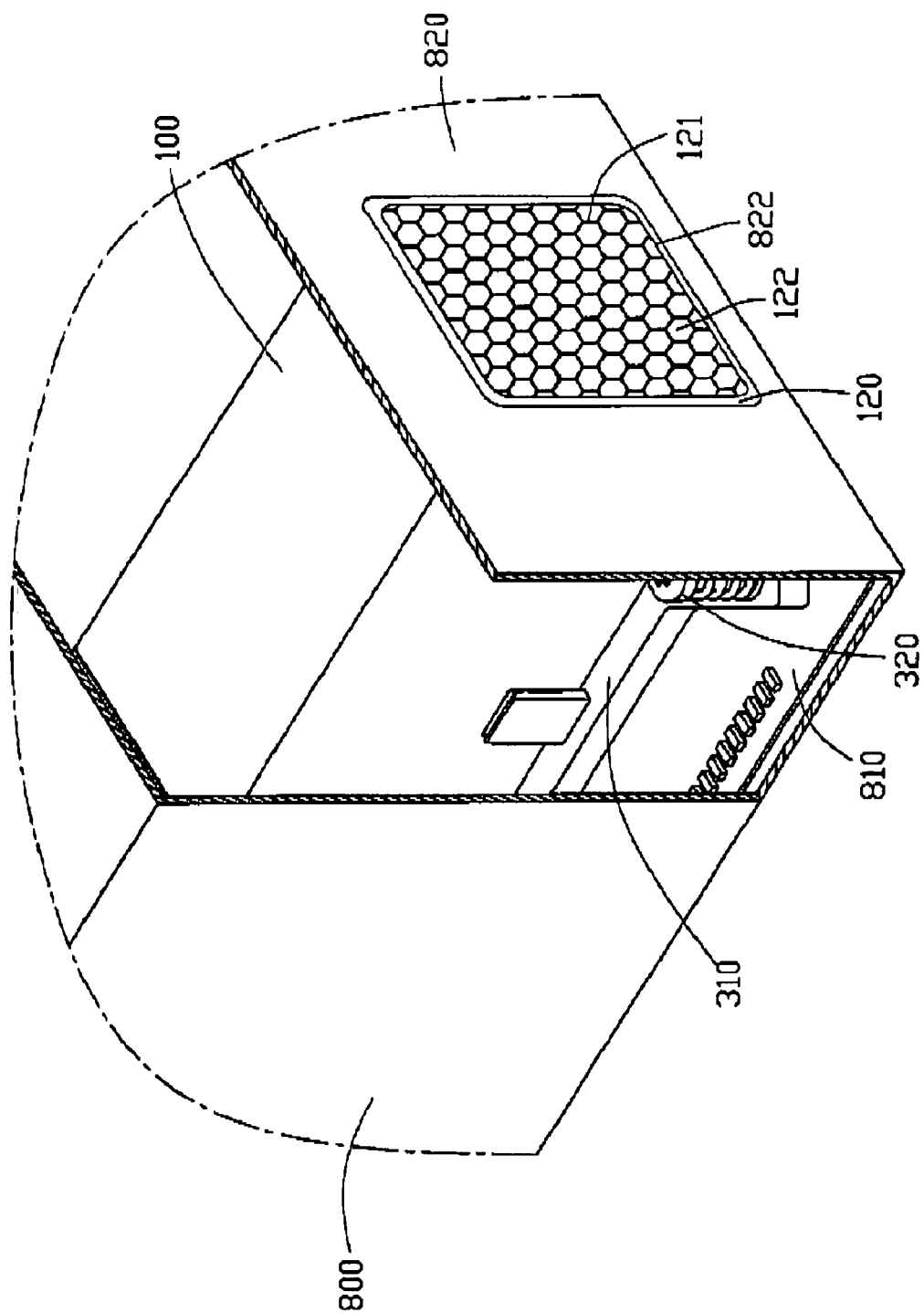
FIG. 5 is an assembled, isometric view of the cooling apparatus assembled in the computer as shown in FIG. 1 but viewed from another aspect.

When assembling the cooling apparatus 700 into the housing 800, the fan 200 is fixed abutting the metal net 121 in the inlet 110 and then the fan duct 100 is mounted onto the supporting device 300, with each first clipping member 130 latched with a corresponding second clipping member 330. Referring also to FIG. 5, the fan duct 100 is inserted into a sidewall 820 of the housing 800, and the outlet 120 is engaged with the sidewall 820 in an opening 822 defined in the sidewall 820. The frame 310 is fixed onto the board 810 by fastening the fasteners 320 to the board 810.

As shown in FIG. 1, alter assembly, the shield 400 is fixed to the sidewall 820 to enclose a gap between the outlet 120 and the sidewall 820. Because the shield 400 seals the gap, the shield 400 has a great effect in preventing EMI between the electronic devices located within the computer 999 and other exterior electronic devices located at outside of the housing, i.e., shielding the electronic element 500 covered by the fan duct 100 from electromagnetic waves emitted from the exterior electronic devices and preventing electromagnetic waves generated by the electronic element 500 covered by the fan duct 100 from radiating to the outside of the housing 800.

It should be emphasized that the above-described preferred embodiment, is merely a possible example of implementation of the principles of the invention, and is merely set forth for a clear understanding of the principles of the invention. Many variations and modifications may be made to the above-described embodiment of the invention without departing substantially from the spirit and principles of the invention. All such modifications and variations are intended to be included herein within the scope of this disclosure and the present invention and be protected by the following claims.

What is claimed is:

1. A cooling apparatus for cooling an electronic element comprising:
    a fan for generating airflow; and
    a fan duct for guiding the airflow, the fan duct comprising:
    an inlet configured for allowing the airflow to enter the fan duct;
    an outlet configured for allowing the airflow to flow out from the fan duct;
    a first metal net fixed to one of the inlet and the outlet, the first metal net defining a plurality of guiding holes for the airflow to pass through, and a maximum distance in a traverse direction of each of the guiding holes being smaller than one twentieth of a wavelength of an electromagnetic wave emitted from the electronic element; and
    a second metal net fixed to the other one of the inlet and the outlet, the second metal net defining a plurality of guiding holes for the airflow to pass through, and a maximum distance in a traverse direction of each of the guiding holes of the second metal net being smaller than one percent of a wavelength of the electromagnetic wave.

2. The cooling apparatus according to claim 1, further comprising a shield set around the fan duct.

3. The cooling apparatus according to claim 1, further comprising a supporting device for supporting the fan duct.

4. The cooling apparatus according to claim 3, wherein the fan duct comprises at least one first clipping member, and the supporting device comprises at least one second clipping member engaged with the first clipping member to fasten the fan duct on the supporting member.

5. The cooling apparatus according to claim 4, wherein the supporting device comprises a frame, and the frame comprises four beams cooperatively forming a rectangle opening therebetween, and the fan duct defines another opening communicating with opening of the frame such that the electronic element is extendable into the fan duct via the opening and the another opening.

6. The cooling apparatus according to claim 5, wherein the second clipping member is fanned on the frame.

7. An electronic device, comprising:
    a housing comprising a sidewall defining a first opening therein, an electronic element being mounted within the housing;
    a cooling apparatus accommodated in the housing, the cooling apparatus comprising:
    an airflow generator for generating airflow to dissipate heat from the electronic element;
    an airflow duct defining a second opening to allow the electronic element to pass through to enter the airflow duct; the airflow duct comprising an inlet configured for allowing the airflow to flow into the airflow duct, an outlet configured for showing the airflow to flow out of the airflow duct, and a first metal net and a second metal net configured for allowing the airflow to pass through and attenuating electromagnetic waves generated by the electronic element, the outlet engaging in the first opening, the first metal net being fixed to one of the inlet and the outlet, and the second metal net being fixed in the other one of the inlet and the outlet; wherein a plurality of guiding holes is formed on the first and the second metal nets, and a maximum distance in a traverse direction of each of the guiding holes perpendicular to the flowing direction of the airflow is smaller than one twentieth of a wavelength of an electromagnetic wave emitted from the electronic element; and
    a shield set around the outlet of the airflow duct to enclose a gap between the outlet and the housing so as to shield the electronic element from electromagnetic waves emitted from an exterior source located outside of the housing and to prevent electromagnetic waves generated by the electronic element radiating to the outside of the housing;
    wherein the maximum distance the traverse direction of each of the guiding holes perpendicular to the flowing direction of the airflow is smaller than one percent of a wavelength of the electromagnetic wave emitted from the electronic element.

8. The electronic device according to claim 7, wherein the cooling apparatus comprises a supporting device for supporting the airflow duct and securing the airflow duct to the housing.

9. The electronic device according to claim 8, wherein the airflow duct comprises at least one first clipping member, and the supporting device comprises at least one second clipping member corresponding to the first clipping member, and the first clipping member and the second clipping member engage with each other to fasten the airflow duct on the supporting device.

10. The electronic device according to claim 9, wherein the supporting device comprises a frame, and the second clipping member is formed on the frame.

11. The electronic device according to claim 10, wherein the housing comprises a circuit board for supporting the electronic element and the cooling apparatus thereon.

12. The electronic device according to claim 11, wherein the supporting device further comprises a plurality of fasteners for fixing the frame onto the circuit board.

13. An electronic device, comprising:
- a housing comprising a sidewall defining a first opening therein, an electronic element being mourned within the housing;
- a cooling apparatus accommodated in the housing, the cooling apparatus comprising:
- an airflow generator for generating airflow to dissipate heat from the electronic element;
- an airflow duct defining a second opening to allow the electronic element to pass through to enter the airflow duct; the airflow duct comprising an inlet configured for allowing the airflow to flow into the airflow duct, an outlet configured for allowing the airflow to flow out of the airflow duct, and a first metal net and a second metal net configured for allowing the airflow to pass through and attenuating electromagnetic waves generated by the electronic element the outlet engaging in the first opening, the first metal net being fixed to one of the inlet and the outlet, and the second metal net being fixed in the other one of the inlet and the outlet; and
- a shield set around the outlet of the airflow duct to enclose a gap between the outlet and the housing so as to shield the electronic element from electromagnetic waves emitted from an exterior source located outside of the housing and to prevent electromagnetic waves generated by the electronic element radiating to the outside of the housing;
- wherein the electronic element comprises a heat sink with a plurality of parallel fins configured for dissipating heat therefrom, the heat sink being received in the airflow duct between the inlet and outlet.

* * * * *